United States Patent [19]

Byatt

[11] Patent Number: 5,285,100
[45] Date of Patent: Feb. 8, 1994

[54] SEMICONDUCTOR SWITCHING DEVICE

[75] Inventor: Stephen Byatt, Bromham, England

[73] Assignee: Texas Instruments Incorporated, Dallas, Tex.

[21] Appl. No.: 985,543

[22] Filed: Dec. 4, 1992

Related U.S. Application Data

[63] Continuation of Ser. No. 719,888, Jun. 21, 1991, abandoned, which is a continuation of Ser. No. 379,506, Jul. 13, 1989, abandoned.

[30] Foreign Application Priority Data

Jul. 22, 1988 [GB] United Kingdom ............... 88 17574

[51] Int. Cl.$^5$ .................... H01L 29/90; H01L 29/74
[52] U.S. Cl. ..................................... 257/566; 257/146; 257/154; 257/162; 257/173; 257/577; 257/587
[58] Field of Search .............. 357/13, 38; 257/109, 257/146, 154, 162, 173–175, 566, 577, 587; 361/91

[56] References Cited

U.S. PATENT DOCUMENTS

| | | | |
|---|---|---|---|
| 3,928,093 | 12/1975 | Van Tongerloo et al. | 148/186 |
| 4,109,274 | 8/1978 | Belenkov et al. | 357/38 |
| 4,176,369 | 11/1979 | Nelson et al. | 357/24 |
| 4,282,555 | 8/1981 | Svedberg | 361/56 |
| 4,321,524 | 3/1982 | Petrovic | 323/229 |
| 4,396,809 | 8/1983 | Brunssen | |
| 4,415,779 | 11/1983 | Bowman | |
| 4,456,940 | 6/1984 | Hammerberg et al. | 361/56 |
| 4,514,747 | 4/1985 | Miyata et al. | 357/38 |
| 4,529,847 | 7/1985 | DeBalko | |
| 4,567,500 | 1/1986 | Avery | 357/38 |
| 4,587,656 | 5/1986 | Hartman et al. | 357/38 |
| 4,631,561 | 12/1986 | Foroni et al. | 357/13 |
| 4,653,084 | 3/1987 | Ahuja | |
| 4,656,366 | 4/1987 | Davis et al. | 307/252 |
| 4,695,916 | 9/1987 | Satoh et al. | 361/56 |
| 4,700,380 | 10/1987 | Ahuja | |
| 4,710,949 | 12/1987 | Ahuja | |

FOREIGN PATENT DOCUMENTS 2113907B 3/1986 United Kingdom ............... 29/90
2205685A 12/1988 United Kingdom ............... 29/90

OTHER PUBLICATIONS

D. C. Goldthorp et al., "An Integated Circuit Composite PNPN Diode", *IEDM* 79 (1979) pp. 180–183.
"Telecommunications Protection Circuits-Protection Design Guide", Texas Instruments Ltd., Bedford, England 1987.

*Primary Examiner*—J. Carroll
*Attorney, Agent, or Firm*—Russell E. Baumann; Richard L. Donaldson; René E. Grossman

[57] ABSTRACT

A semiconductor switching device that is suitable for use as a remote isolation device (RID) in telephone networks. The semiconductor switching device is a two-terminal voltage sensitive device that switches from an open-circuit condition to a short-circuit condition at a fixed breakover voltage, appears as an open-circuit below the breakover voltage, and appears as a short-circuit above the breakover voltage. When semiconductor switching devices are installed in a telephone network, they are held in their short-circuit condition by the network voltage supply and do not affect the normal operation of the network but will switch to their open-circuit condition if the network voltage supply is reduced to below the breakover voltage, and therefore, parts of the network may be isolated from each other by reducing the voltage supply. Isolation of the parts of the network from each other facilitates testing for maintenance purposes.

8 Claims, 5 Drawing Sheets

EQUIVALENT CIRCUIT OF INTEGRATED RID

Fig.3.

BAR LAYOUT OF A SINGLE RID CELL.

LAYOUT OF SHORTED EMITTER DESIGN

P⁻ DIFFUSION TO INCREASE ZENER VOLTAGE

SEMICONDUCTOR SWITCHING DEVICE

This application is a continuation of application Ser. No. 07/719,888, filed Jun. 21, 1991 (Abandoned), which is a continuation of application Ser. No. 07/379,506, filed Jul. 13, 1989 (Abandoned).

The present invention relates to a semiconductor switching device that has a particular application in telephone networks.

According to the invention, a semiconductor switching device comprises a PNP transistor connected to an NPN transistor and a reverse breakdown PN diode, wherein the respective emitter regions of the transistors are the terminals of the semiconductor switching device, the collector region of the NPN transistor is connected to the base region of the PNP transistor and to the N-type region of the reverse breakdown PN diode, and the collector region of the PNP transistor is connected to the base region of the NPN transistor and to the P-type region of the reverse breakdown PN diode.

The semiconductor switching device behaves as a voltage sensitive switch that appears as a high impedance to voltages applied at the emitter regions of the transistors, (the emitter region of the PNP transistor being positive relative to the emitter region of the NPN transistor) up to voltages slightly in excess of the reverse breakdown voltage of the PN diode, that changes to a low impedance once the applied voltage is large enough to cause reverse conduction, through the PN diode, the transistion from the high to the low impedance state being by way of a negative impedance state, and reverts to the high impedance state, by way of the negative impedance state, on the removal of the applied voltage.

The semiconductor switching device, is capable of operating as a remote isolation device (RID) when installed in the supply lines to a subscriber's apparatus, in a telephone network, since the line supply voltage may be used to make it switch between its high and low impedance status and thereby act as a voltage controlled switch that will disconnect the subscriber's apparatus in response to a remote command, the remote command being effected by a reduction in the line supply voltage. The semiconductor switching device is designed to go to its low impedance state when subjected to the normal line supply voltage and, therefore, it does not interfere with the use of the subscriber's apparatus.

The reverse breakdown PN diode is, preferably, formed at the collector-base junction of one of the transistors and may be formed either at the collector-base junction of the NPN transistor or the collector-base junction of the PNP transistor.

Thus the NPN transistor may include an additional N-type region, that extends across the collector-base junction of the transistor, of higher impurity concentration than the collector region of the transistor, which additional N-type region provides a part of the reverse breakdown PN diode.

Alternatively, the PNP transistor may include an additional N-type region, that extends across the collector-base junction of the transistor, of higher impurity concentration than the base region of the transistor, which additional N-type region provides a part of the reverse breakdown PN diode.

In either arrangement, the impurity concentration of the additional N-type region may be of the order of $10^{20}$ to $10^{21}$ atoms per cubic centimeter.

There may be a resistive element connected between the base and the emitter regions of the NPN transistor.

Preferably, the semiconductor switching device has the form of a monolithic integrated circuit, in order to minimise the cost per device and the space occupied by the device when installed in, say, a telephone network.

An integrated circuit semiconductor switching device may comprise an N-type semiconductor body that is both the base region of the PNP transistor and the collector region of the NPN transistor,, a first P-type island, at a surface of the N-type body, that is both the base region of the NPN transistor and the collector region of the PNP transistor, a second P-type island, at the surface of the semiconductor body, that is the emitter region of the PNP transistor, an N-type island, in the first P-type island, that is the emitter region of the NPN transistor, and conductive contact regions providing respective terminals for the second P-type island and the N-type island.

An impurity concentration of between $10^{14}$ and $10^{16}$ atoms per cubic centimeter is suitable for the N-type semiconductor body, and, an impurity concentration of between $10^{17}$ and $10^{19}$ atoms per cubic centimeter is suitable for the first and second P-type islands.

Alternatively, the integrated circuit semiconductor switching device may comprise a P-type semiconductor body that is both the base region of the NPN transistor and the collector region of the PNP transistor, an N-type island, at a surface of the P-type body, that is both the base region of the PNP transistor and the collector region of the NPN transistor, a P-type island, in the N-type island, that is the emitter region of the PNP transistor, an N+-type island, at the surface of the P-type body, that is the emitter region of the NPN transistor, and conductive contact regions providing respective terminals for the P-type island and the N+-type island.

An impurity concentration of between $10^{14}$ and $10^{16}$ atoms per cubic centimeter is suitable for the N-type island, and, an impurity concentration of between $10^{17}$ and $10^{19}$ atoms per cubic centimeter, is suitable for the P-type semiconductor body and the P-type island.

The integrated circuit semiconductor switching device based on an N-type body may include a semiconductor resistor connected between the conductive contact region with the N+-type island and the first P-type island, providing a resistive element connected between the base and emitter regions of the NPN transistor.

The integrated circuit semiconductor switching device based on a P-type body may include a semiconductor resistor connected between the conductive contact region with the N+-type island and the P-type body, providing a resistive element between the base and emitter regions of the NPN transistor.

An alternative arrangement to that of providing a resistive element between the base and emitter regions of the NPN transistor is that of providing an NPN transistor with low emitter efficiency, this being achieved by partly short-circuiting the base-emitter junction of the PNP transistor, either by laying out the conductive contact region with the N+-type island to contact the first P-type island, when the integrated circuit semiconductor switching device is based on an N-type body, or laying out the conductive contact region with the N+- type island to contact the P-type body, when the integrated circuit semiconductor switching device is based on the P-type body.

The integrated circuit semiconductor switching device based on an N-type body may include a further N+-type island that extends across the junction between the first P-type island and the N-type body, and the first P-type island may include a P-type region immediately adjacent to the further N+-type island.

The alternative integrated circuit semiconductor switching device based on a P-type body may include a further N+-type island that extends across the junction between the N-type island and the P-type body, and the P-type body may include a P−-type region immediately adjacent to the further N+-type island. In either arrangement, the further N+- type island provides a part of the reverse breakdown diode and the P−-type region allows adjustment of the breakdown voltage.

An impurity concentration of between $10^{20}$ and $10^{21}$ atoms per cubic centimeter is suitable for the further N+-type island, and, an impurity concentration of between $10^{15}$ and $10^{17}$ atoms per cubic centimeter is suitable for the P−-type region.

The semiconductor switching device requires connection in a specific sense, relative to the supply voltage in a telephone network, say, in order to function as a remote isolation device or a voltage sensitive switch, and for such an application it is desirable to provide a compound semiconductor switching device comprising first and second semiconductor switching devices connected in parallel with each other and in opposite senses one relative to the other, which compound switching device behaves as a voltage sensitive switch to an applied voltage of either polarity.

The first and second semiconductor switching devices may be formed in a common semiconductor body and be interconnected by means of conductive contact regions laid on a surface of the semiconductor body. The semiconductor body may be either N-type or P-type material.

A first and a second form of the semiconductor switching device, and integrated circuit arrangements of the first and second forms of the semiconductor switching device, in accordance with the represent invention, will now be described by way of example only and with reference to the accompanying drawings, in which.

Figure 1:
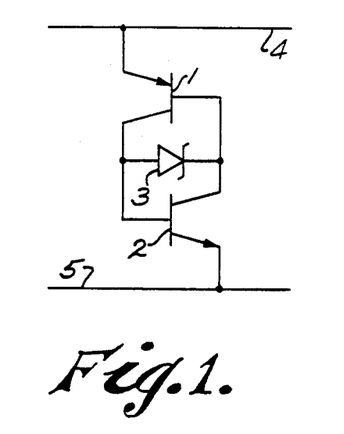
FIG. 1 is a circuit diagram representing the first form of the semiconductor switching device.

Referring to FIG. 1 of the accompanying drawings, the first form of the semiconductor switching device comprises a PNP bipolar transistor 1, an NPN bipolar transistor 2, and a reverse breakdown diode 3 that is generally known as a zener diode. The collector electrode of the PNP transistor 1 is connected to the base electrode of the NPN transistor 2, the base electrode of the PNP transistor 1 is connected to the collector electrode of the NPN transistor 2, and the reverse breakdown diode 3 has its anode and cathode electrodes connected respectively to the collector electrode and the base electrode of the NPN transistor 2. The emitter electrodes of the PNP transistor 1 and the NPN transistor 2 provide respective terminals 4 and 5 for the semiconductor switching device. The breakdown diode 3 is effectively connected in parallel with the collector-base junctions of the PNP transistor 1 and the NPN transistor 2 and has a lower reverse breakdown voltage than either of those junctions. The semiconductor switching device is responsive to the magnitude of a voltage applied to the terminals 4 and 5 and is intended for operation with an applied voltage in the sense that makes the terminal 4 positive with respect to the terminal 5. On the application to the terminals 4 and 5 of a voltage less than the breakdown voltage of the diode 3 in the sense indicated, the reverse breakdown diode 3 and the collector base function of the NPN transistor 2 both act to block current flow that would occur through the emitter electrodes of the PNP transistor 1 and the NPN transistor 2. On the application to the terminals 4 and 5 of a voltage, in the same sense, that exceeds the reverse breakdown voltage of the diode 3 (and which need not exceed the breakdown voltage for the NPN transistor 2), the diode 1 permits current flow. If the applied voltage is increased gradually, current flowing into the emitter electrode of the PNP transistor 1 and out of the emitter electrode of the NPN transistor 2 will first increase gradually as the applied voltage increases and there will be corresponding current flows in the collector electrodes of the transistors 1 and 2. The transistor currents will continue to increase with increasing applied voltage up to a current (the breakover current) beyond which the two transistors act together as a negative impedance, each of the transistors then driving the other into its fully saturated state and they then present, together, a high negative dynamic impedance for a range of currents slightly in excess of the breakover current. The negative dynamic impedance region extends from the breakover current to a current known as the holding current. For a range of currents in excess of the holding current, the saturated transistors present a low positive dynamic impedance to current flow. When the transistors are in their positive dynamic impedance state, alteration of the conditions at the terminals 4 and 5 to cause the current flow through the transistors 1 and 2 to move into the negative impedance region of their combined current/voltage relationship will result in a rapid decrease of the current drawn through the terminals 4 and 5 and the turning off of both the transistors 1 and 2. The applied voltage at which the breakover current is reached is known as the breakover voltage. Reversal of the applied voltage, that is, the application of an increasing voltage that makes the terminal 5 positive with respect to the terminal 4 results in substantially no current flow through the transistors 1 and 2 since their respective base-emitter junctions are reverse biased by such an applied voltage. There will eventually be breakdown of both base-emitter junctions in response to the applied voltage and there will be current flow through the transistor but there is no negative impedance region in the current/voltage relationship for applied voltages that make the terminal 5 positive with respect to the terminal 4.

Referring to FIG. 1, the PNP transistor 1 and the NPN transistor 2 may, in practice, be provided by, respectively, the $P_1N_1P_2$ and $N_1P_2N_2$ regions of a four region ($P_1N_1P_2N_2$) device in which the $N_1$ region acts both as the base region of the PNP transistor 1 and the collector region of the NPN transistor 2, and the $P_2$ region acts both as the collector region of the PNP transistor 1 and the base region of the NPN transistor 2.

Referring to FIG. 1, the breakover voltage for the semiconductor switching device is determined by the reverse breakdown voltage of the diode 3 and is, as a result, set by the choice of the doping levels of the semiconductor regions that make up the reverse breakdown diode 3. The breakover current for the semiconductor switching device is determined by the emitter efficiencies of the transistors 1 and 2 and is, as a result, set by the design of the emitters of the transistors 1 and 2.

Figure 2:
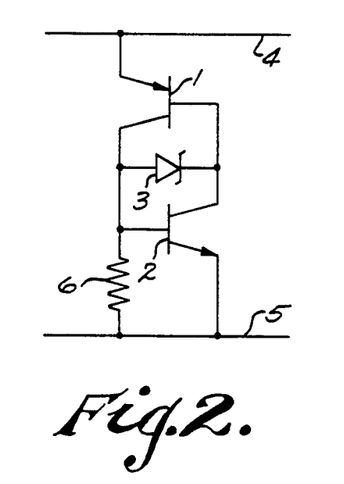
FIG. 2 is a circuit diagram representing the second form of the semiconductor switching device.

Referring to FIG. 2 of the accompanying drawings, the second form of the semiconductor switching device includes a PNP transistor 1, an NPN transistor 2, a reverse breakdown diode 3, and a resistor 6. The PNP transistor 1, the NPN transistor 2, and the reverse breakdown diode 3 are connected to each other in the same manner as are the transistors and diode in FIG. 1 and the emitter electrodes of the transistors 1 and 2, as in FIG. 1, are connected to the respective terminals 4 and 5. The resistor 6 is connected between the base and the emitter electrodes of the NPN transistor 2. The resistor 6 acts as a current shunt to the base electrode of the NPN transistor 2 and, as a result of its shunting action, the resistor 6 affects the breakover current for the semiconductor switching device. The breakover current of the semiconductor switching device is therefore set by the device designer by means of the resistor 6.

The operation of the semiconductor switching device represented by FIG. 2, is essentially the same as that of the semiconductor switching device represented by FIG. 1, the effect of the resistor 6 that is included in FIG. 2 and not in FIG. 1 being that the breakover current of the device represented by FIG. 2 is dependent on the magnitude of the resistor 6.

The current/voltage relationship of the semiconductor switching device that is represented by FIG. 2, as is that for the device represented by FIG. 1, is asymmetrical in that it includes a range of currents over which the impedance of the device is negative when the applied voltage is in the sense that makes the terminal 4 positive with respect to the terminal 5, and includes no negative resistance portion for situations where the terminal 4 is negative with respect to the terminal 5.

A symmetrical current/voltage relationship is obtained by the connection of two semiconductor switching devices between the terminals 4 and 5, where the two devices are connected in opposite senses between the terminals 4 and 5 and operation changes from one device to the other when the sense of the voltage applied to the terminals 4 and 5 is changed.

Figure 3:
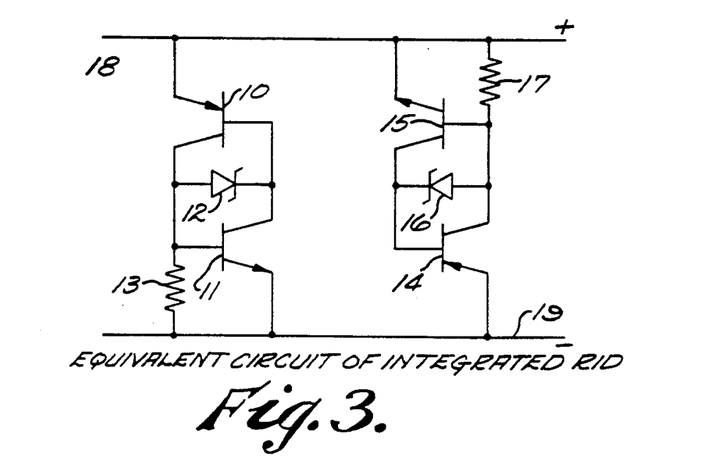
FIG. 3 is a circuit diagram representing dual semiconductor switching devices of the second form.

FIG. 3 of the accompanying drawings represents a compound semiconductor switching device comprising two of the devices represented by FIG. 2 connected in opposite senses one to the other between two terminals 13 and 19. One device comprises a PNP transistor 10, an NPN transistor 11, a reverse breakdown diode 12, and a resistor 13, connected together as are the corresponding components of the device represented by FIG. 2, and with the emitter electrodes of the PNP transistor 10 and the NPN transistor 11 connected respectively to the terminals 18 and 19. The other device comprises a PNP transistor 14, an NPN transistor 15, a reverse breakdown diode 16, and a resister 17, again, connected together as are the corresponding components of the device represented by FIG. 2, but with the emitter electrodes of the PNP transistor 14 and the NPN transistor 15 connected respectively to the terminals 19 and 18.

When the compound semiconductor switching device that is represented by FIG. 3 is subjected to an increasing externally applied voltage that makes the terminals 18 more positive than the terminal 19, the emitter-base junction of the NPN transistor 15 blocks current flow. The applied voltage is of the sense to forward bias the base-collector junction of the NPN transistor 15 and the diode 16 by way of the resistor 17, but current flow through these routes is blocked by the collector-base and base-emitter diodes of the PNP transistor 14. A continued increase in the applied voltage without change in its sense would eventually force the reverse breakdown of one of the blocking junctions, but before that occurs, the reverse breakdown diode 12 will permit current flow through the transistors 10 and 11, and the semiconductor switching device that includes the reverse breakdown diode 12 will change to its low impedance conductive state. The reversal of the sense of the applied voltage will result in the changeover of the devices as regards which one remains in its non-conductive state and which one changes to its conductive state.

In FIG. 3, the first form of the semiconductor switching device, as represented by FIG. 1, may be substituted for each of the second form of the device, as represented by FIG. 2.

Figure 4:
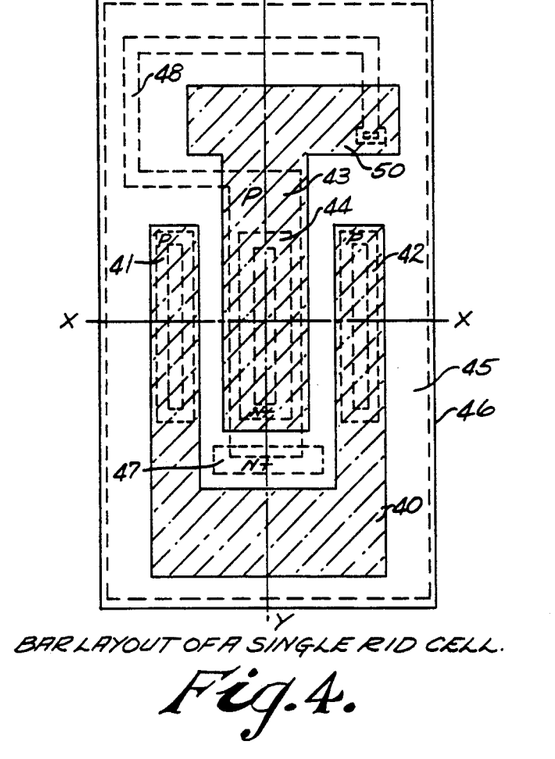
FIG. 4 is a plan view of an integrated circuit arrangement of the second form of the semiconductor switching device.

Referring to FIG. 4 of the accompanying drawings, the integrated circuit arrangement of the second form of the semiconductor switching device comprises a body 45 of N-type silicon into a surface of which are diffused P-type regions 41, 42, and 43. The P-type regions 41, 42, and 43 are situated alongside each other with the region 43 occupying a position between the regions 41 and 42. A first N+-type region 44 is diffused into the P-type region 43 and a further N+-type region 47 is diffused into the same surface of the N-type body 45 as is diffused the P-type region 43, the further N+-type region 47 being positioned to overlie a part of the junction between the N-type body 45 and the P-type region 43. A further P-type region 48, diffused into the surface of the N-type body 45, connects to the P-type region 43 and extends in a part loop into the N-type body 45. The surface of the N-type body 45 into which the regions are diffused is covered by a layer 46 of silicon dioxide except for windows provided in the silicon dioxide permitting electrical contact to be made with the P-type regions 41, 42 and 48 and the N+-type region 44. Electrical contact with the P-type regions 41 and 42 is provided by a first metallic layer 40 and electrical contact with the N-type region 44 and the P-type region 48 is provided by a second metallic layer 50, both of which layers overlie the silicon dioxide layer 46 which separates the metallic layers 40 and 50 from the surface of the N-type body 45 where there are no windows in the silicon dioxide layer 46.

Figure 5:
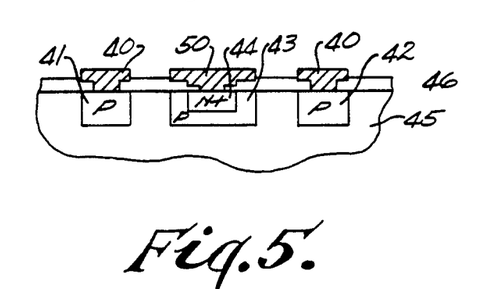
FIG. 5 is a sectional view through the integrated circuit arrangement of FIG. 4 taken along the line X—X.
Figure 6:
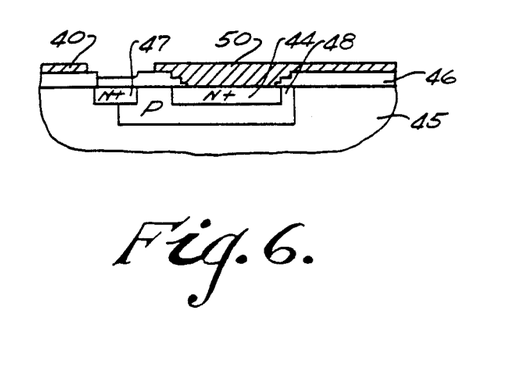
FIG. 6 is a sectional view through the integrated circuit arrangement of FIG. 4 taken along the line Y—Y.

FIGS. 5 and 6 of the accompanying drawings, representing respectively a part view along a transverse cross-section through the P-type regions 41, 42, and 43, and a part view along a longitudinal cross-section through the P-type region 43, assist in clarifying FIG. 4. In FIGS. 4, 5, and 6, the regions 41, 42, 43, and 45 provide a PNP transistor structure (the regions 41 and 42 are connected together by the metallic layer 40) that is the PNP transistor 1 of FIG. 2, the regions 43, 44, and 45 provide an NPN transistor structure that is the NPN transistor 2 of FIG. 2, the regions 47 and 43 provide a reverse breakdown diode that is the diode 3 of FIG. 2, and the region 48 provides a resistor that is the resistor 6 of FIG. 2. The regions 43 and 45 are shared by the PNP and the NPN transistors effectively making the base electrode of the PNP transistor the same as the collector electrode of the NPN transistor, and viceversa. The metallic layers 40 and 50 provide the terminals 4 and 5 of FIG. 2.

Figure 9:
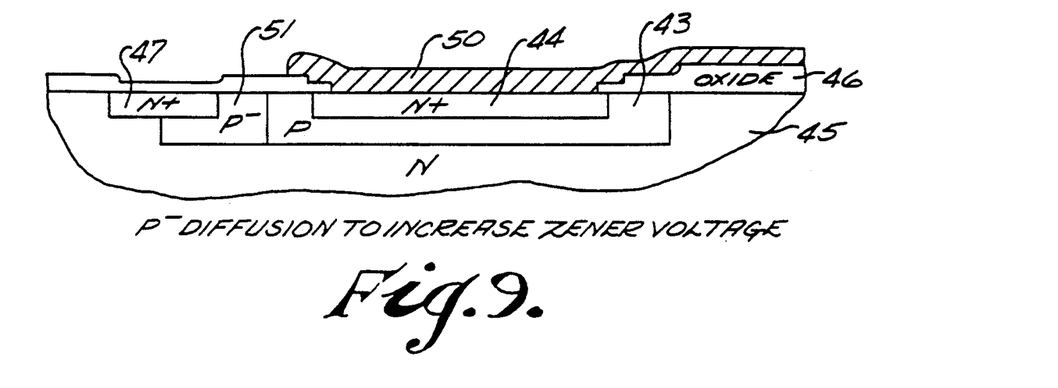
FIG. 9 is a sectional view through an integrated circuit arrangement, with a modification, of the second form of the integrated circuit arrangement.

Referring to FIGS. 2, 4, 5, and 6, the range of reverse breakdown voltages for the diode 3 may lie in the range 7 volts to 20 volts, corresponding to impurity concentrations for the P-type region 43 of between $10^{17}$ and $10^{18}$ atoms per cubic centimeter. Reverse breakdown voltages exceeding 20 volts but less than the reverse breakdown voltage for the junction between the P-type region 43 and the N-type region 45 are achieved by the modified arrangement represented by FIG. 9 which shows an additional region 51 that is a P-type region positioned in the P-type region 43 immediately next to the N+-type region 47. In the modified arrangement represented by FIG. 9, the P-type region 43 acts as a common region of the PNP and NPN transistors while the N+-type region 47 and the P−-type region 31 act as the reverse breakdown diode. This arrangement avoids any conflicting doping level requirements for the P−-type and P-type regions 51 and 43, when a reverse breakdown diode with a breakdown voltage in excess of 20 volts is required (limited, of course, to the reverse breakdown voltage for the junction between the N-type region 45 and the P-type region 43).

An integrated circuit arrangement of the first form of the semiconductor switching device may be substantially the same as that shown in FIG. 4 for the second form of the device, except that the resistive region 48, shown in FIG. 4, is omitted in an integrated circuit arrangement of the first form of the semiconductor switching device, the characteristics obtained by including the resistive region 48, shown in FIG. 4, may be provided by modification of the structure of one of the active devices.

Figure 7:
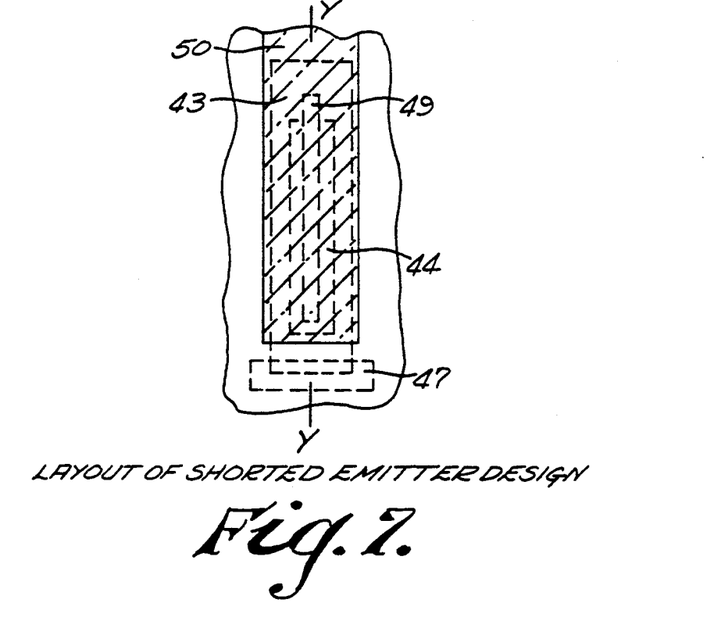
FIG. 7 is a part plan view of an integrated circuit arrangement of the first form of the semiconductor switching device.
Figure 8:
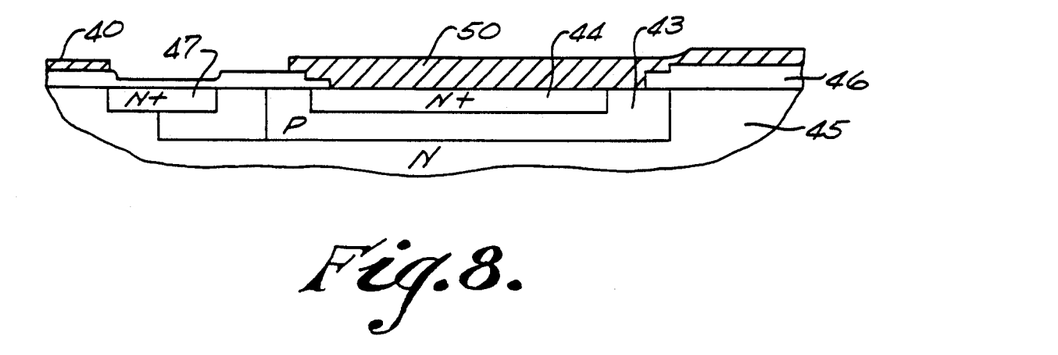
FIG. 8 is a sectional view through the integrated circuit arrangement of FIG. 7 taken along the line Y—Y.

FIGS. 7 and 8 of the accompanying drawings show one modification that may be used in an integrated circuit arrangement of the first form of the semiconductor switching device to compensate for the absence of the resistive region 48 that is shown in FIG. 4. FIGS. 7 and 8 show that part of the integrated circuit arrangement of the first form of the semiconductor switching device corresponding to the P-type region 43 of FIG. 4 and its immediately adjacent regions.

Referring to FIGS. 7 and 8 of the accompanying drawings, an integrated circuit arrangement of the first form of the semiconductor switching device includes a window in the silicon dioxide layer 46. The window extends through one end of the N+-type region 44 and over the P-type region 43, permitting the metallic layer 50 to lie in electrical contact with both the N+-type region 44 and the P-type region 43. This arrangement represents a conductive bridge between the base and the emitter regions of the NPN transistor 2 of FIG. 1, resulting in a transistor low emitter injection efficiency and an increase in the breakover current for the semiconductor switching device of FIG. 1. It will be understood, therefore, that the inclusion of the partly short-circuited base-emitter junction in the NPN transistor 2 of FIG. 1 removes the need for the resistor 6 included in the second form of the semiconductor switching device, represented by FIG. 2.

Referring to FIGS. 4 to 9 of the accompanying drawings, a doping level in the range $10^{14}$ to $10^{16}$ atoms per cubic centimeter is suitable for the N-type region 45; a doping level in the range $10^{17}$ to $10^{19}$ atoms per cubic centimeter is suitable for each of the P-type regions 41, 42, and 43; a doping level in the range $10^{20}$ to $10^{21}$ atoms per cubic centimeter is suitable for each of the N-type regions 44 and 47; and a doping level in the range $10^{15}$ to $10^{17}$ atoms per cubic centimeter is suitable for the P-type region 51. A depth in the range 2 to 20 microns is suitable for each of the P-type regions 41, 42, and 43 and a depth of about half that of the P-type region 43 is suitable for each of the N-type regions 44 and 47. Both limits are included in each of the ranges given above.

Figure 10:
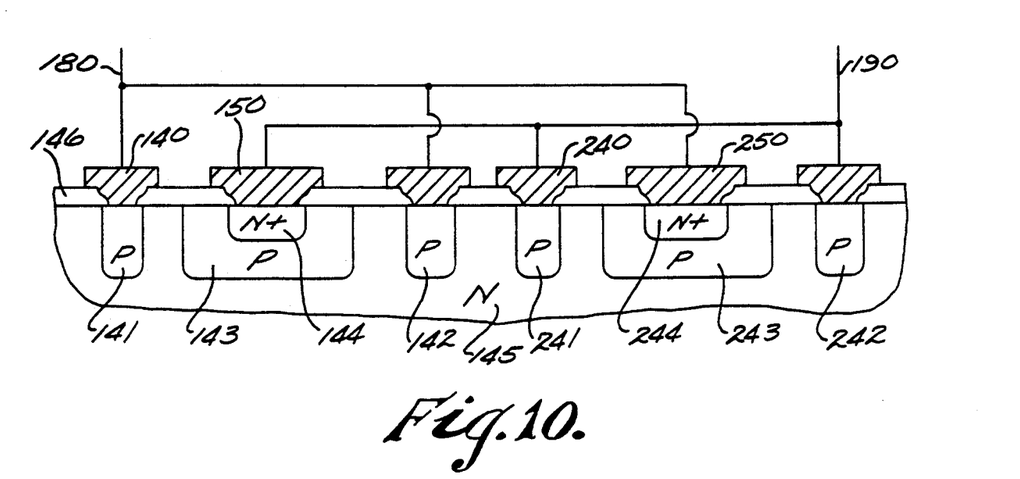
FIG. 10 is a sectional view through an integrated circuit arrangement comprising two devices of either the first or the second form.

Referring to FIG. 10 of the accompanying drawings, an integrated circuit arrangement comprising two of the semiconductor switching devices of either the first or the second form includes an N-type silicon body 145 at one surface of which are formed a first set of regions 141, 142, 143, and 144 arid a second set of similar regions 241, 242, 243, and 244. The regions 141, 142, 143, 241, 242, and 243 are P-type and the regions 144 and 244 are N+-type. The regions 141, 142, and 244 are connected together by a metallised layer 140 and the regions 144, 241, and 242 are connected together by a metallised layer 150. The metallised layers perform the function of connection terminals 18 and 19 to the dual device structure. A silicon dioxide layer 146 is included.

The breakover voltage of the switching device shown in FIG. 1 is determined by the breakdown characteristics of the PN junction breakover diode that is connected in parallel with the base-collector junctions of the transistors, and it is possible to obtain reliable switching of the device in response to the supply voltages normally used for telephone systems. Telephone system supply voltages are normally of the order of 50 volts or below. The same situation of clean and reliable switching is obtained for the switching devices shown in FIGS. 2 and 3.

The switching device shown in FIG. 2 provides, in addition to a clean and reliable switching characteristic, a well defined switching current that depends on the value of the resistor connected in parallel with the base-emitter junction of the NPN transistor.

Figure 12:
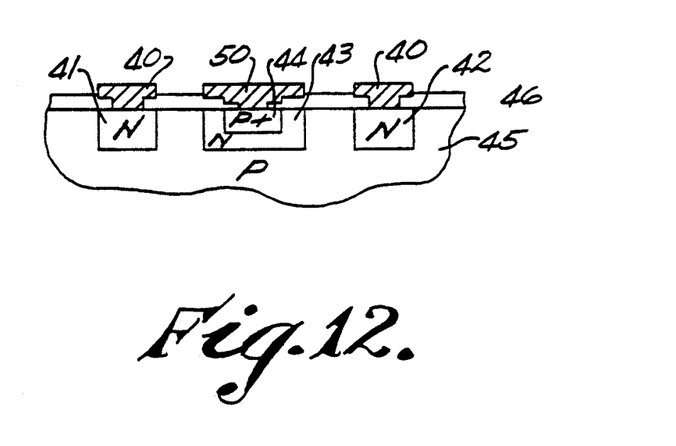
FIG. 12 is a section view similar to FIG. 5 with P-type semiconductor body.
Figure 13:
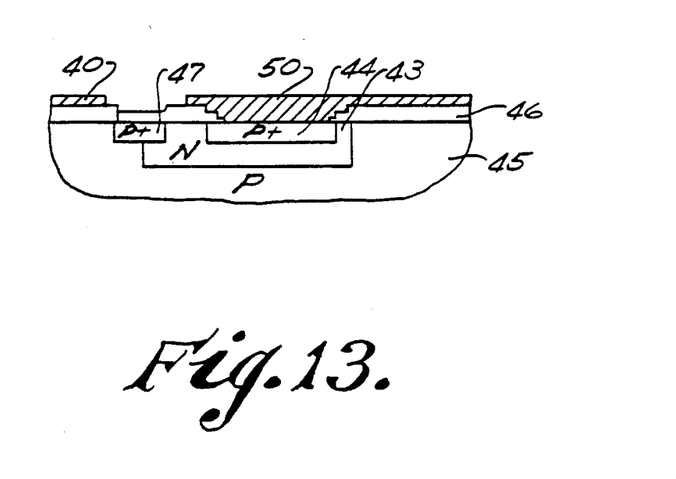
FIG. 13 is a section view similar to FIG. 6 with P-type semiconductor body.

It will be understood by those skilled in the electrical art that the device resulting from the structure represented by FIGS. 5 and 6, say, may be provided by a structure based on a P-type semiconductor body rather than on an N-type semiconductor body as has been described as shown in FIGS. 12 and 13 where corresponding numerals indicate components corresponding to FIGS. 5 and 6. A compound device, corresponding to that represented by FIG. 10, may also be provided in an arrangement based on a P-type semiconductor body.

Figure 11:
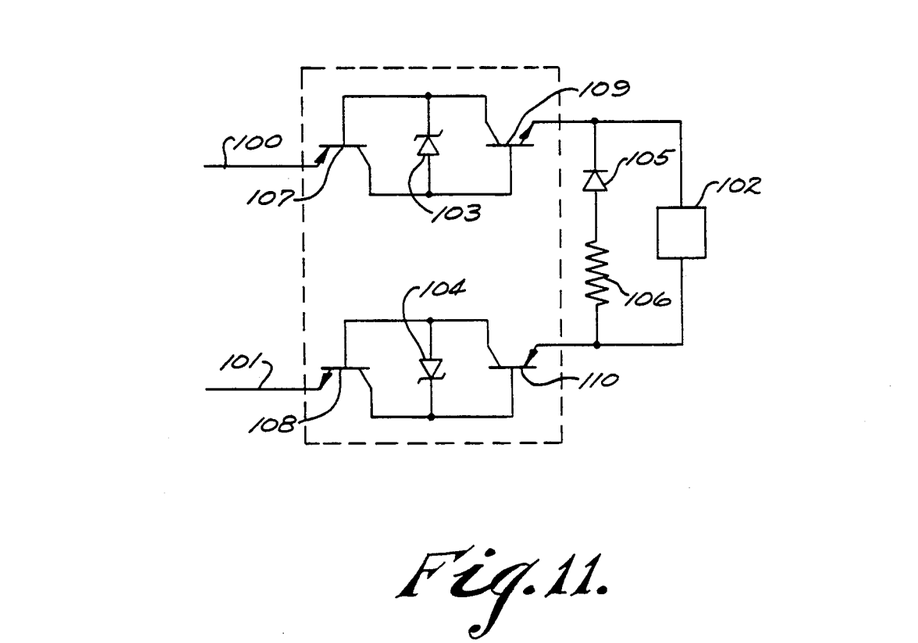
FIG. 11 represents semiconductor switching devices of the first form installed in a telephone system.

FIG. 11 of the accompanying drawings represents a part of telephone system including an incoming line 100, an outgoing line 101, a subscriber's telephone apparatus 102, and semiconductor switching devices 103 and 104 of the first form as represented by FIG. 1 of the accompanying drawings. A network consisting of a diode 105 in series with a resistor 106 is connected in parallel with the telephone apparatus 102. The semiconductor switching device 103 is connected in series with the incoming line 100 with such polarity as to permit current flow along the incoming line 100 towards the telephone apparatus 102 and the semiconductor switching device is connected in series with the outgoing line 101 with such polarity as to permit current flow along the outgoing line 101 away from the telephone apparatus 102. The semiconductor switching devices 103 and 104 are located at the telephone apparatus 102 effectively at the respective ends of the incoming and outgoing lines 100 and 101. The incoming and outgoing lines 100 and 101 connect the telephone apparatus 102 to some form of central or control office.

Referring to FIG. 11, the inclusion of the semiconductor switching devices 103 and 104 in the respective incoming and outgoing lines 100 and 101 permits the performance of tests on the telephone apparatus 102 from the central office by way of the lines 100 and 101, and permits the performance of tests on the lines 100 and 101, themselves. The testing of parts of the telephone system is made possible because the semiconductor switching devices 103 and 104 behave as voltage sensitive switches that are controllable from the central office by means of the voltages applied to the lines 100 and 101. The reverse breakdown voltage of the reverse breakdown diodes included in the semiconductor switching devices is set at a value that causes the semiconductor switching devices 103 and 104 to be conductive when the telephone apparatus 102 is "off-hook", in which case the semiconductor switching devices 103 and 104 are electrically "transparent", that is, they have no effect on normal system operation and are maintained in their low-impedance conductive states by the current flow through the lines 100 and 101 under the influence of the normal supply voltage from the central office. However, the semiconductor switching devices 103 and 104 may be switched off by reducing the central office supply voltage and will then isolate the telephone apparatus 102 from the lines 100 and 101. With the semiconductor switching devices 103 and 104 in the switched off condition, the parameters of the lines 100 and 101 may be checked with the knowledge that the telephone apparatus 102 is effectively disconnected form these lines. The semiconductor switching devices 103 and 104 also permit checks to be made to the telephone apparatus 102 which should appear as a high impedance, when "on-hook", to the normal voltage supply from the central office. Also with the telephone apparatus 102 "on-hook", the diode 105 and the resistor 106 permit checks to determine whether or not there are semiconductor switching devices connected in the lines 100 and 101 (conduction occurs only when the voltage applied to the outgoing line 101 is positive relative to that applied to the incoming line 100 and exceeds the combined breakdown voltages of the breakdown diodes in the semiconductor switching devices 103 and 104) and to identify the incoming line relative to the outgoing line.

Referring to FIG. 11, it will be noted that the semiconductor switching device 103 connected in the incoming line 100 is connected in the opposite sense to the semiconductor switch device 104 connected in the outgoing line 101. The need for the installer to pay attention to the polarity of each semiconductor switching device when installing it may be avoided by providing two semiconductor switching devices, such as the devices 103 and 104, in a single four-terminal package in which the terminals 107 and 108 are identified as a first port, the terminals 108 and 109 are identified as a second port and the package has clearly marked top and bottom surfaces. It will be evident that, as regards the package with a pair of semiconductor switching devices, it is immaterial whether the first port is connected to the lines 100 and 101 of the telephone apparatus 102, and similarly for the second port, provided that the top surface of the package is always kept "above" the bottom surface. The need for an installer to pay attention to either the polarities of the semiconductor switching devices or the attitude of the package, when installing the devices, is avoided by providing compound semiconductor switching devices, as represented by FIG. 3, or as represented by FIG. 10, for example, in which case each of the devices 103 and 104 is replaced by a compound device.

For a telephone system in which the line supply voltage is 48 volts, suitable breakover voltages for the semiconductor switching devices lie in the range 10 to 20 volts, both limits included, that is to say, the range of breakover voltages extends slightly beyond the range lying between one quarter and one third of the line supply voltage.

When semiconductor switching devices as herein described are included in telephone systems for the purposes explained with reference to FIG. 11, they are generally known as remote isolation devices (RIDS).

The remote isolation function performed by semiconductor switching devices as herein described may be carried out by electrical networks that include many more circuit elements than the semiconductor switching devices, but such electrical networks are costlier to manufacture, and are bulkier and less convenient to handle and install than the semiconductor switching devices described.

Semiconductor switching devices, as described herein, may be employed, at minimal cost for installation, as remote isolation devices or maintenance termination units (MTUS) in a variety or ways. The installation of RIDs at demarcation points in a telephone network will permit the telephone operating company to divide up the network for testing purposes by variation of the network supply voltages. Thus a telephone maintenance centre or repair service centre may determine the condition of virtually any selected part of the network (as regards the existence of resistive faults or open-circuit conditions) without the need for personnel to leave the maintenance or repair centre for the purpose of testing the network equipment.

The semiconductor switching devices, when specifically intended for use as telephone network RIDS, may be provided in enclosures appropriate to the intended use ranging from single-line units to plug-in modules for multi-line applications such as PABX trunk lines.

In all cases where the semiconductor switching devices are used as RIDs they will, at low cost, effect maintenance cost reduction, avoid revenue losses by facilitating the quick repair and return to service of high-revenue lines, prevent difficulties associated with disagreements as to who is responsible for repair when a line is faulty, permit a 24-hour test facility without the need to send repair personnel out to investigate customer complaints of faults and generally provide an environment leading to the maintenance of high quality transmissions.

I claim:

1. In a circuit system having a supply line to an apparatus and having a remote isolation device to disconnect the apparatus in response to a remote command, the improvement in which the remote isolation device comprises a semiconductor switching device comprising a PNP transistor having a P-type emitter region, an N-type base region, and a P-type collector region, an NPN transistor having an N-type emitter region, a P-type base region, and an N-type collector region, and a reverse breakdown PN diode having a P-type region and an N-type region, wherein the respective emitter regions of the transistors are connected in series in the supply line to serve as terminals of the semiconductor switching device, the collector region of the NPN transistor is connected to the base region of the PNP transistor and to the N-type region of the reverse breakdown PN diode, and the collector region of the PNP transistor is connected to the base region of the NPN transistor and to the P-type region of the reverse breakdown PN diode, the semiconductor switching device comprising a P-type semiconductor body that is both the base region of the NPN transistor and the collector region of the PNP transistor, an N-type island, at a surface of the P-type body, that is both the base region of the PNP transistor and the collector region of the NPN transistor, a P+-type island, in the N-type island, that is the emitter region of the PNP transistor, an N-type island, at the surface of the P-type body, that is the emitter region of the NPN transistor, and conductive contact regions providing respective terminals for the P+-type island and the N-type island, the semiconductor switching device including a further P+-type island that extends across the junction between the N-type island and the P-type body, which further P+-type island provides a part of the reverse breakdown diode and has a N−-type region in the P-type body immediately adjacent to the further P+-type island.

2. A system for a telephone network having a semiconductor switching device as claimed in claim 1, wherein the impurity concentration of the N−-type region is of the order $10^{15}$ to $10^{17}$ atoms per cubic centimeter.

3. In a circuit system having a supply line to an apparatus and having a remote isolation device to disconnect the apparatus in response to a remote command, the improvement in which the remote isolation device comprises a semiconductor switching device comprising a PNP transistor having a P-type emitter region, an N-type base region, and a P-type collector region, an NPN transistor having an N-type emitter region, a P-type base region, and an N-type collector region, and a reverse breakdown PN diode having a P-type region and an N-type region, wherein the respective emitter regions of the transistors are connected in series in the supply line to serve as terminals of the semiconductor switching device, the collector region of the NPN transistor is connected to the base region of the PNP transistor and to the N-type region of the reverse breakdown PN diode, and the collector region of the PNP transistor is connected to the base region of the NPN transistor and to the P-type region of the reverse breakdown PN diode, the reverse breakdown PN diode being formed at a junction of the collector and base region in one of the transistors, the semiconductor switching device comprising a P-type semiconductor body that is both the base region of the NPN transistor and the collector region of the PNP transistor, an N-type island, at a surface of the P-type body, that is both the base region of the PNP transistor and the collector region of the NPN transistor, a P+-type island, in the N-type island, that is the emitter region of the PNP transistor, and N-type island, at the surface of the P-type body, that is the emitter region of the NPN transistor, and conductive contact regions providing respective terminals for the P+type island and the N-type island, the semiconductor switching device including a further P+-type island that extends across the junction between the N-type island and the P-type body, which further P+-type island provides a part of the reverse breakdown diode and has a N−-type region in the P-type body immediately adjacent to the further P+-type island.

4. A system for a telephone network having a semiconductor switching device as claimed in claim 3 wherein the impurity concentration of the N−-type region is of the order $10^{15}$ to $10^{17}$ atoms per cubic centimeter.

5. In a circuit system having a supply line to an apparatus and having a remote isolation device to disconnect the apparatus in response to a remote command, the improvement in which the remote isolation device comprises a monolithic semiconductor switching device comprising a NPN transistor having a N-type emitter region, an P-type base region, and a N-type collector region, an PNP transistor having an P-type emitter region, a N-type base region, and an P-type collector region, and a reverse breakdown NP diode having a N-type region and an P-type region, wherein the respective emitter regions of the transistors are connected in series in the supply line to serve as terminals of the semiconductor switching device, the collector region of the PNP transistor is connected to the base region of the NPN transistor and to the P-type region of the reverse breakdown NP diode, and the collector region of the NPN transistor is connected to the base region of the PNP transistor and to the N-type region of the reverse breakdown NP diode, the semiconductor switching device comprising a N-type semiconductor body that is both the base region of the PNP transistor and the collector region of the NPN transistor, an P-type island, at a surface of the N-type body, that is both the base region of the NPN transistor and the collector region of the PNP transistor, a N+type island, in the P-type island, that is the emitter region of the NPN transistor, an P-type island, at the surface of the N-type body, that is the emitter region of the PNP transistor, and conductive contact regions providing respective terminals for the N+-type island and the P-type island, the semiconductor switching device including a further N+-type island that extends across the junction between the P-type island and the N-type body, which further N+-type island provides a part of the reverse breakdown diode and has a P−-type region in the N-type body immediately adjacent to the further N+-type island.

6. A system having a semiconductor switching device as claimed in claim 5 wherein the impurity concentration of the P−-type region is of the order of $10^{15}$ to $10^{17}$ atoms per cubic centimeter.

7. In a circuit system having a supply line to an apparatus and having a remote isolation device to disconnect the apparatus in response to a remote command, the improvement in which the remote isolation device comprises a semiconductor switching device comprising a NPN transistor having a N-type emitter region, an P-type base region, and a N-type collector region, an PNP transistor having an P-type emitter region, a N-type base region, and an P-type collector region, and a reverse breakdown NP diode having a N-type region and an P-type region, wherein the respective emitter regions of the transistors are connected in series in the supply line to serve as terminals of the semiconductor switching device, the collector region of the PNP transistor is connected to the base region of the NPN transistor and to the P-type region of the reverse breakdown NP diode, and the collector region of the NPN transistor is connected to the base region of the PNP transistor and to the N-type region of the reverse breakdown NP diode, the reverse breakdown NP diode being formed at a junction of the collector and base region in one of the transistors, the semiconductor switching device comprising a N-type semiconductor body that is both the base region of the PNP transistor and the collector region of the NPN transistor, an P-type island, at a surface of the N-type body, that is both the base region of the NPN transistor and the collector region of the PNP transistor, a N+-type island, in the P-type island, that is the emitter region of the NPN transistor, and P-type island, at the surface of the N-type body, that is the emitter region of the PNP transistor, and conductive contact regions providing respective terminals for the N+-type island and the P-type island, the semiconductor switching device including a further N+-type island that extends across the junction between the P-type island and the N-type body, which further N+-type island provides a part of the reverse breakdown diode and has a P−-type region in the N-type body immediately adjacent to the further N+-type island.

8. A system for a telephone network having a semiconductor switching device as claimed in claim 7 wherein the impurity concentration of the P−-type region is of the order $10^{15}$ to $10^{17}$ atoms per cubit centimeter.

* * * * *